United States Patent
Seddon et al.

(10) Patent No.: US 10,014,245 B2
(45) Date of Patent: Jul. 3, 2018

(54) METHOD FOR REMOVING MATERIAL FROM A SUBSTRATE USING IN-SITU THICKNESS MEASUREMENT

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/244,979

(22) Filed: Aug. 23, 2016

(65) Prior Publication Data

US 2017/0084505 A1 Mar. 23, 2017

Related U.S. Application Data

(60) Provisional application No. 62/219,666, filed on Sep. 17, 2015.

(51) Int. Cl.
*H01L 21/302* (2006.01)
*H01L 21/461* (2006.01)
(Continued)

(52) U.S. Cl.
CPC .. *H01L 23/49827* (2013.01); *H01L 21/02035* (2013.01); *H01L 21/304* (2013.01); *H01L 21/3065* (2013.01); *H01L 21/3083* (2013.01); *H01L 21/486* (2013.01); *H01L 21/4825* (2013.01); *H01L 21/4853* (2013.01);
(Continued)

(58) Field of Classification Search
None
See application file for complete search history.

(56) References Cited

U.S. PATENT DOCUMENTS 6,104,062 A 8/2000 Zeng
7,507,638 B2 * 3/2009 Mancini ............ H01L 21/3065
257/E21.214
(Continued)

FOREIGN PATENT DOCUMENTS

JP 2002076326 A 3/2002
JP 2002368218 A 12/2002
(Continued)

*Primary Examiner* — Stephanie P Duclair
(74) *Attorney, Agent, or Firm* — Kevin B. Jackson

(57) ABSTRACT

A method for removing material from a substrate includes providing the substrate with first and second opposing major surfaces. A masking layer is disposed along one of the first major surface and the second major surface, and is provided with a plurality of openings. The substrate is placed within an etching apparatus and material is removed from the substrate through openings using the etching apparatus. The thickness of the substrate is measured within the etching apparatus using a thickness transducer. The measured thickness is compared to a predetermined thickness and the material removal step is terminated responsive to the measured thickness corresponding to the predetermined thickness. In one embodiment, the method is used to more accurately form recessed regions in semiconductor die, which can be used in, for example, stacked device configurations.

20 Claims, 6 Drawing Sheets

(51) Int. Cl.

| | | |
|---|---|---|
| *H01B 13/00* | (2006.01) | |
| *B23P 15/00* | (2006.01) | |
| *C03C 25/00* | (2018.01) | |
| *C23F 1/00* | (2006.01) | |
| *H01L 23/498* | (2006.01) | |
| *H01L 21/48* | (2006.01) | |
| *H01L 21/3065* | (2006.01) | |
| *H01L 21/78* | (2006.01) | |
| *H01L 23/495* | (2006.01) | |
| *H01L 21/67* | (2006.01) | |
| *H01L 21/66* | (2006.01) | |
| *H01L 21/56* | (2006.01) | |
| *H01L 23/31* | (2006.01) | |
| *H02M 3/158* | (2006.01) | |
| *H01L 23/482* | (2006.01) | |
| *H01L 25/065* | (2006.01) | |
| *H01L 25/00* | (2006.01) | |
| *H01L 23/544* | (2006.01) | |
| *H01L 23/00* | (2006.01) | |
| *H01L 21/02* | (2006.01) | |
| *H01L 21/304* | (2006.01) | |
| *H01L 21/308* | (2006.01) | |
| *H01L 27/146* | (2006.01) | |

(52) U.S. Cl.
CPC ...... *H01L 21/565* (2013.01); *H01L 21/67069* (2013.01); *H01L 21/78* (2013.01); *H01L 22/12* (2013.01); *H01L 22/26* (2013.01); *H01L 23/3107* (2013.01); *H01L 23/3114* (2013.01); *H01L 23/4822* (2013.01); *H01L 23/4951* (2013.01); *H01L 23/49503* (2013.01); *H01L 23/49541* (2013.01); *H01L 23/49562* (2013.01); *H01L 23/49575* (2013.01); *H01L 23/49811* (2013.01); *H01L 23/49838* (2013.01); *H01L 23/49866* (2013.01); *H01L 23/544* (2013.01); *H01L 23/562* (2013.01); *H01L 24/05* (2013.01); *H01L 25/0655* (2013.01); *H01L 25/0657* (2013.01); *H01L 25/50* (2013.01); *H01L 27/14683* (2013.01); *H02M 3/158* (2013.01); *H01L 27/14625* (2013.01); *H01L 27/14685* (2013.01); *H01L 2223/5446* (2013.01); *H01L 2223/54426* (2013.01); *H01L 2224/04042* (2013.01); *H01L 2224/48091* (2013.01); *H01L 2225/06555* (2013.01); *H01L 2225/06593* (2013.01); *H01L 2225/06596* (2013.01)

(56) References Cited

U.S. PATENT DOCUMENTS

2008/0099435 A1* 5/2008 Grimbergen ............ G03F 1/80
  216/60
2014/0134828 A1* 5/2014 Burghout .......... H01L 21/02076
  438/464

FOREIGN PATENT DOCUMENTS

| JP | 2003243356 A | 8/2003 |
| JP | 2004281551 A | 10/2004 |
| JP | 2007208074 A | 8/2007 |
| JP | 2010205761 A | 9/2010 |

* cited by examiner

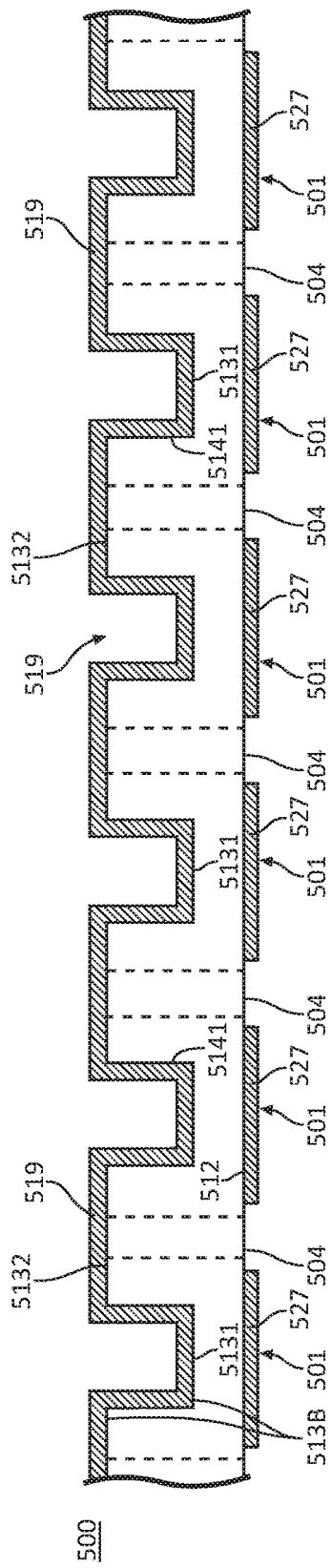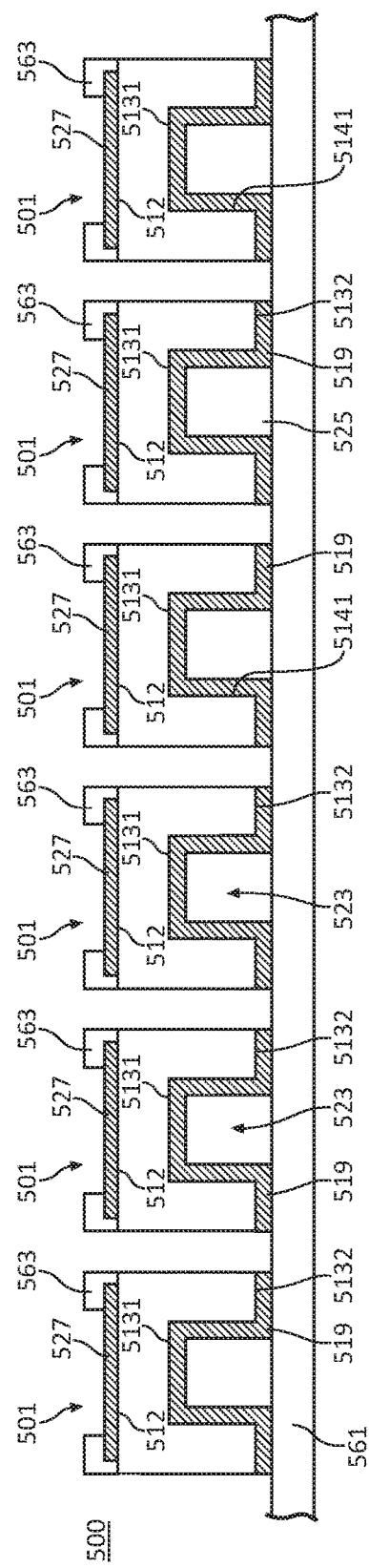

METHOD FOR REMOVING MATERIAL FROM A SUBSTRATE USING IN-SITU THICKNESS MEASUREMENT

CROSS REFERENCE TO RELATED APPLICATION

This application claims priority to U.S. Provisional Application No. 62/219,666 filed on Sep. 17, 2015, the content of which is hereby incorporated by reference.

BACKGROUND

The present invention relates, in general, to electronics and, more particularly, to methods for forming electronic devices such as semiconductor dies.

In the past, the semiconductor industry utilized various methods and equipment to etch substrates, such as semiconductor wafers. One such technique is called dry etching or plasma etching, which has been used to etch the semiconductor wafer itself, or other materials formed on the semiconductor wafer, such as insulating materials and conductive materials. One challenge with drying etching processes is accurately determining when to terminate the etching process, which is often termed "end-point" detection. Past techniques have included running one or more test wafers to determine the time and etch conditions necessary to achieve the desired results. Product wafers are then run using the results of the test wafer characterization. One problem with this approach is that it takes time to run the test wafers, which impacts manufacturing cycle-time. Also, this approach does not catch drifting processes in real time, which leads to wafers having to be re-processed to achieve the desired results or scrapped.

Other past approaches to end-point detection have included adding additional etching time to over-etch the semiconductor wafer and characterization of residual etch gases in the etch chamber. Problems with these approaches have included, for example, inaccurate measurement of real-time semiconductor material etch rates, yield losses due to under-etching and the need for reworking wafers, yield losses due to inconsistencies in etching reworked wafers including loss of passivation layer thicknesses, and required process characterization studies to determine etch recipes when new device types are implemented, which impacts cycle time and manufacturing costs.

Additional complicating factors in the manufacturability of dry etching processes have included etch rate variability caused by device types being processed, the amount of exposed semiconductor material to be removed, conductive and passivation materials used with the semiconductor wafers, and types of processes the semiconductor wafers were previously exposed to. Further, recent developments in new designs in semiconductor device topography, such as deep and wide recessed regions, have presented processing challenges because these new devices typically do not use etch stop layers. This factor makes the manufacturability of such devices difficult.

Accordingly, it is desirable to have a method that more accurately determines the amount of material removed during a dry etching processes including, for example, recess formation processes. It would be beneficial for the method to be cost effective, to be in-situ process compatible, to be manufacturable in the absence of etch stop layers, and to minimize any damage to or contamination of the processed material.

BRIEF DESCRIPTION OF THE DRAWINGS

FIGS. 8 and 9 illustrate the embodiment of FIG. 3 after further processing in accordance with the present invention.

Figure 1:
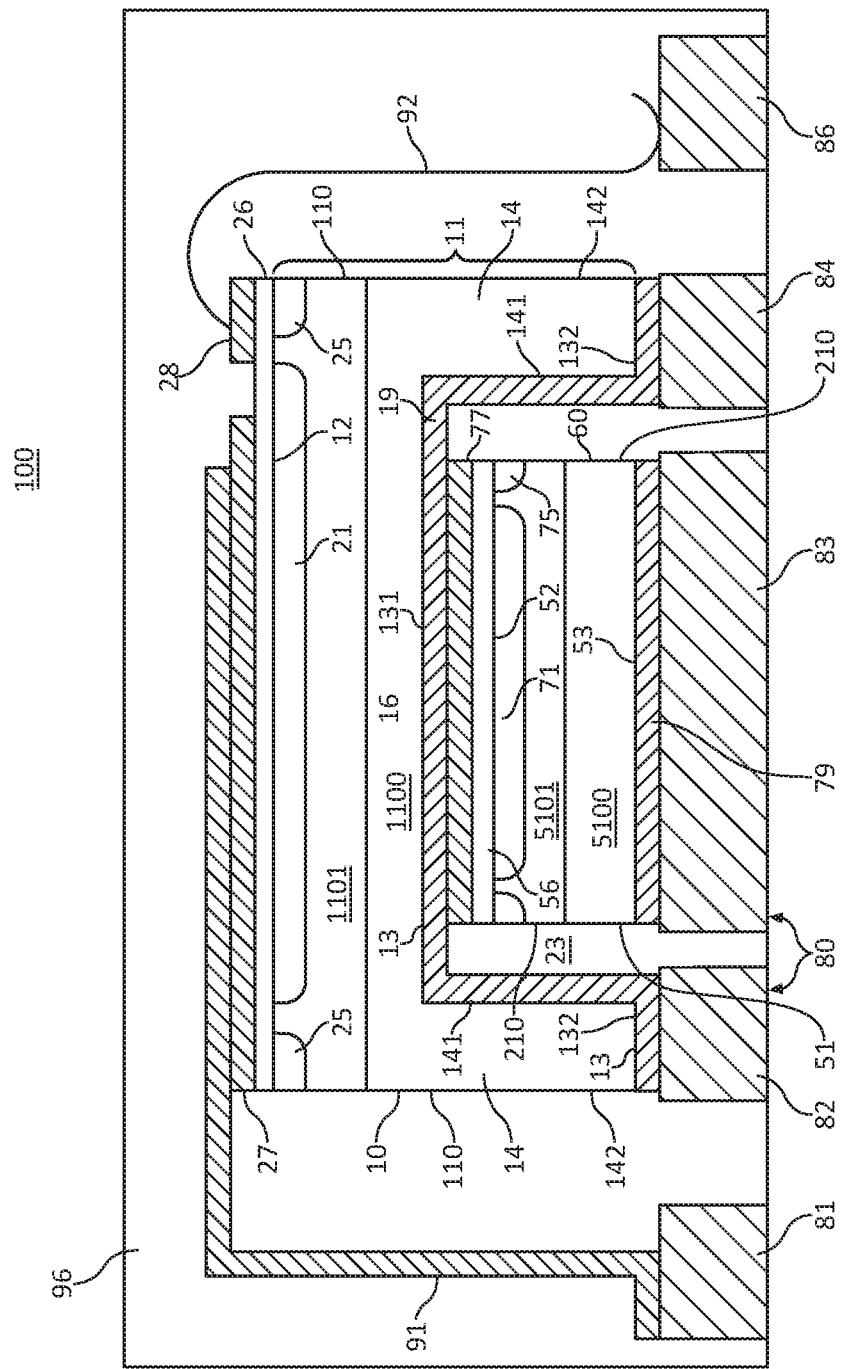
FIG. 1 illustrates a cross-sectional view of a stacked semiconductor device structure manufactured in accordance with a method of the present invention.

For simplicity and clarity of the illustration, elements in the figures are not necessarily drawn to scale, and the same reference numbers in different figures donate the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of an MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify: the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action, but that there may be some small but reasonable delay, such as propagation delay, between the reaction that is initiated by the initial action. Additionally, the term while means a certain action occurs at least within some portion of a duration of the initiating action. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word over lapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a method for removing material from a substrate, such as a semiconductor wafer, and measuring the thickness of the substrate real-time (i.e., in-situ or physically within the etching apparatus) during the removal process to determine when a predetermined thickness target has been accomplished, and without physically removing the substrate from the etching apparatus to the outside environment. In one embodiment, the measuring step is done within the etching chamber of the etching apparatus. In another embodiment, the measuring step can be done in the loading station of the etching apparatus. In one embodiment, the method is used to form recessed regions extending inward from a major surface of the substrate. In another embodiment, the removal process is done without using an etch stop structure. In a further embodiment, the thickness of the substrate is measured at different locations on the substrate. The present embodiments provide for, among other things, a more reliable and repeatable method of determining when to terminate a material removal step. The method is suitable for many processes, including, for example, deep and/or wide recessed region formation and die singulation. In the present description, it is understood that predetermined thickness or predetermined target thickness includes a specific value or a range of values.

More particularly, in one embodiment, a method of removing material from a substrate includes providing the substrate having first and second opposing major surfaces, and a masking layer is formed along one of the first major surface and the second major surface, the masking layer having a plurality of openings. The method includes placing the substrate within an etching apparatus having an etch chamber and removing material from the substrate through the plurality of openings using the etching apparatus. The method includes measuring thickness of the substrate within the etching apparatus to provide a measured thickness, comparing the measured thickness to a predetermined target thickness, and terminating the removing step responsively to the measured thickness corresponding to the predetermined target thickness.

In another embodiment, a method of removing material from a substrate includes providing the substrate having a plurality of die formed as part the substrate and separated from each other by spaces, wherein the substrate has first and second opposing major surfaces, and wherein a protective layer is formed along one of the first major surface and the second major surface, the protective layer having a plurality of openings exposing portions of the substrate disposed between the spaces. The method includes placing the substrate within an etching apparatus having an etch chamber, and removing material from the substrate through the openings using the etching apparatus, wherein during the removing step, the method further includes measuring thickness of the substrate within the etching apparatus to provide a measured thickness, comparing the measured thickness to a predetermined thickness, and terminating the removing step responsively to the measured thickness corresponding to the predetermined thickness. In a further embodiment, providing the substrate includes providing the substrate absent an etch stop layer. In a still further embodiment, terminating the removing step occurs before etching entirely through the substrate to form a plurality of recessed portions separated by spaces.

In a further embodiment, a method of removing material from a substrate includes providing the substrate having a plurality of die formed as part the substrate and separated from each other by spaces, wherein the substrate has first and second opposing major surfaces, and wherein the substrate comprises active device regions adjacent the first major surface, and wherein a masking layer is formed along the second major surface, the masking layer having a plurality of openings that expose portions of the substrate. The method includes placing the substrate within a plasma etching apparatus having a processing chamber and removing material from the substrate through the openings using the plasma etching apparatus, wherein during the removing step, the method further includes measuring material removal within the plasma etching apparatus to provide a measured thickness corresponding to an amount of material removed, comparing the measured thickness to a predetermined thickness, and terminating the removing step responsively to the measured thickness corresponding to the predetermined thickness, wherein the step of terminating occurs before etching entirely through the substrate to provide a plurality of recessed regions. In another embodiment, the method includes placing the substrate onto a carrier substrate before placing the substrate with the plasma etching apparatus. In a further embodiment, measuring comprising measuring within the etch chamber more than once during the removal step.

FIG. 1 illustrates a cross-sectional view of a stacked semiconductor device structure 100. Stacked semiconductor device 100 is an example of a device having a recessed portion 23 or recessed region 23 manufactured using a method in accordance with the present embodiment. Stacked semiconductor device structure 100 includes a first semiconductor device 10 having recessed portion 23, a second semiconductor device 60 physically disposed at least partially within recessed portion 23 and electrically connected to first semiconductor device 10, a conductive substrate 80 or conductive lead frame 80, and a package body 96 encapsulating first semiconductor device 10, second semiconductor device 60, and at least portions of conductive substrate 80. Portions of conductive substrate 80 can be exposed to the outside of package body 96. In an alternative embodiment, conductive substrate 80 is not used and portions of first semiconductor device 10, second semiconductor device 60, and conductive connective structures used to interconnect the devices to the outside are exposed through package body 96.

In one embodiment first semiconductor device 10 comprises a singulated semiconductor device 10, an insulated gate field effect transistor (IGFET) 10, MOSFET 10, power semiconductor device 10, or switching device 10. First semiconductor device 10 includes a singulated body of semiconductor material 11, body of semiconductor material 11, or singulated semiconductor substrate 11, which, in one embodiment, is formed from a semiconductor wafer that has been singulated along singulation lines to provide singulated edges 110. Further description of an example singulation process operation will be provided later. In one embodiment, singulated body of semiconductor material 11 includes a substrate portion 1100 and a semiconductor layer portion 1101, which in some embodiments can be an epitaxial layer.

Singulated body of semiconductor material 11 includes a first major surface 12 and a second major surface 13 opposite to first major surface 12. Second major surface 13 includes a recessed surface portion 16 defining a portion 131 of second major surface 13. Recessed surface portion 16 is bounded by opposing sidewall portions 14 or opposing interconnect portions 14 extending outward from portion 131 of region of semiconductor material 11 in cross-sectional view. In one embodiment, sidewall portions 14 define portions 132 of second major surface 13. Portions 132 can also be referred to as tip portions 132 of sidewall portions 14, which are distal to portion 131 of second major surface 13. Stated another way, portions 132 of second major surface 13 and portion 131 of second major surface 13 lie on or within different planes. In accordance with the present embodiment, sidewall portions 14 include inner sidewall surfaces 141 or inner surfaces 141 and outer sidewall surfaces 142 or outer surfaces 142 opposite to inner surfaces 141. In accordance with the present embodiment, outer surfaces 142 are defined by singulated edges 110 after first semiconductor device 10 is singulated from a semiconductor wafer. Further, in some embodiments sidewall portions 14 are configured as interconnect structures or localized interconnect structures for first semiconductor device 10. More particularly, in some embodiments, sidewall portions 14 facilitate the electrical connection of first semiconductor device 10 to a next level of assembly, such as a printed circuit board, a leadframe, or another semiconductor device.

First semiconductor device 10 further includes active device region 21 and termination regions 25, which can be disposed adjacent first major surface 12 of singulated region of semiconductor material 11. In one embodiment, active region 21 can include a plurality of N-type conductivity regions and/or a plurality of P-type conductivity regions configured to form power semiconductor device structures, such as insulated gate field effect transistor (IGFET) devices, metal-oxide semiconductor field effect transistors (MOSFET) devices, insulated gate bipolar transistor (IGBT) devices, and other similar power semiconductor devices as known to those of skill in the art. The individual N-type regions and P-type regions making up the MOSFET devices are not illustrated in FIG. 1 so as to simplify the description of the present embodiment.

In one embodiment, a layer of material 26 is disposed adjacent first major surface 12. In some embodiments, layer of material 26 can be one or more dielectric layers or materials configured to provide isolation and passivation of the active region 21. In one embodiment, layer of material 26 can be an oxide, a nitride, combinations thereof, or other similar materials as known to those of skill in the art. Layer of material 26 can have openings or vias (not shown) to provide electrical communication between active device region 21 and conductive layers 27 and 28 disposed over or adjacent to layer of material 26. In one embodiment, conductive layers 27 and 28 can be Al—Si alloys, Al/Ni/Au, Cu/Ni/Au, Cu/Ni/Pd, Ti/Ni/Au, Ti/Cu/Ni/Au, Ti—W/Cu/Cu, Cr/Cu/Cu, Cr/Cu/Cu/Ni, Ni—V, Ti/Ni/Ag, Ti/Ni/Ag/Sn, or similar materials as known to those skilled in the art. Conductive layers 27 and 28 can be formed using deposition, sputtering, evaporation, plating, annealing, combinations thereof, and other similar processes as known to those of skill in the art. After formation, the layer can be patterned using, for example, photolithography and etch techniques. It is understood that in some embodiments, one or more masking layers or dielectric layers (not shown) may be included over portions of conductive layers 27 and 28 with openings provided for additional conductive connective structures, such as conductive clips or wires.

In one embodiment, first semiconductor device 10 further includes a conductive layer or layers 19 disposed or affixed adjacent or along second major surface 13 including, for example, portions 131 and 132 and inner surfaces 141 of sidewall portions 14 as generally illustrated in FIG. 1. In other embodiments, some portions of second major surface 13 may not be covered by conductive layer 19. In some embodiments, conductive layer 19 comprises one or more conductive materials deposited or formed using sputtering, evaporation, plating, printing, deposition, dispensing, lift-off, combinations thereof, or other formation techniques as known to those skilled in the art. By way of example, conductive layer 19 can be a metal material, a conductive epoxy material, a solder material, a stencil material, combinations thereof, or other similar materials as known to those of skill in the art. In one embodiment, conductive layer 19 comprises an electroless plated material, such as electroless nickel.

In one embodiment, first semiconductor device 10 is configured as a high-side MOSFET for use in a DC/DC power regulation application. In accordance with the present embodiment, recessed portion 23 or recessed region 23 defined by recessed surface portion 16 and sidewall portions 14 provides an improvement in electrical performance by reducing the series resistance of body of semiconductor material 11 proximate to active device region 21. This improves, for example, Rdson performance. Also, sidewall portions 14 provide an electrical interconnect structure for the drain portion of first semiconductor device 10 to conductive substrate 80. Additionally, sidewall portions 14 provide stability for first semiconductor device 10 during manufacturing including while in wafer form as well as after the singulation process is completed.

In one embodiment, second semiconductor device 60 comprises a singulated semiconductor device 60, an insulated gate field effect transistor (IGFET) 60, MOSFET 60, power semiconductor device 60, or switching device 60. Second semiconductor device 60 includes a singulated body of semiconductor material 51, body of semiconductor material 51, or singulated semiconductor substrate 51, which, in one embodiment is formed from a semiconductor wafer that has been singulated along singulation lines to provide singulated edges 210. In one embodiment, singulated body of semiconductor material 51 includes a substrate portion 5100 and a semiconductor layer portion 5101, which in some embodiments can be an epitaxial layer.

Singulated body of semiconductor material 51 includes a first major surface 52 and a second major surface 53 opposite to first major surface 52. Second semiconductor device 60 can further include active device region 71, and, in some embodiments, termination regions 75, which are disposed adjacent first major surface 52 of singulated region of semiconductor material 51. In one embodiment, active device region 71 can include a plurality of N-type conductivity regions and/or a plurality of P-type conductivity regions configured to form power semiconductor device structures, such as insulated gate field effect transistor (IGFET) devices, metal-oxide semiconductor field effect transistors (MOSFET) devices, insulated gate bipolar transistor (IGBT) devices, and other similar power semiconductor devices as known to those of skill in the art. The individual N-type regions and P-type regions are not illustrated in FIG. 1 no as to simplify the description of the present embodiment.

In one embodiment, a layer of material 56 is disposed adjacent first major surface 52. In some embodiments, layer of material 56 can be one or more dielectric layers or materials configured to provide isolation and passivation of active device region 71. In one embodiment, layer of material 56 can be an oxide, a nitride, combinations thereof, or other similar materials as known to those of skill in the art. Layer of material 56 can have openings or vias (not shown) to provide electrical communication between active device region 71 and conductive layer 77 disposed over or adjacent to layer of material 56. In one embodiment, a conductive layer 79 is disposed adjacent major surface 53. In one embodiment, conductive layers 77 and 79 can be Al—Si alloys, Al/Ni/Au, Al/Ni/Cu, Cu/Ni/Au, Cu/Ni/Pd, Ti/Ni/Au, Ti/Cu/Ni/Au, Ti—W/Cu/Cu, Cr/Cu/Cu, Cr/Cu/Cu/Ni, Ni—V, Ti/Ni/Ag, Ti/Ni/Ag/Sn, or similar materials as known to those skilled in the art. Conductive layers 77 and 79 can be formed using deposition, sputtering, evaporation, plating, annealing, combinations thereof, and other similar processes as known to those of skill in the art. Photolithographic and etch techniques can be used to pattern conductive layer 77. It is understood that a passivation layer(s) can be provided over conductive layer 77 with openings to facilitate electrical connections to second semiconductor device 60. In accordance with the present embodiment, conductive layer 77 is connected to conductive layer 19 of first semiconductor device 10 using a conductive material, such as solder, conductive epoxy, or other similar materials as known to those of skill in the art. In one embodiment, second semiconductor device 60 is configured as a low-side MOSFET for use in a DC/DC power regulation application. One advantage of the present embodiment is that recess portion 23 reduces the overall height of stacked semiconductor device structure 100, and the stacked configuration reduces the lateral size of the structure compared to previous designs.

Conductive substrate 80 or conductive lead frame 80 includes a plurality of conductive leads, conductive lead structures, and/or conductive pads, such as conductive leads 81-86. In one embodiment, conductive lead 83 is configured as a conductive pad for supporting second semiconductor device 60. Conductive substrate 80 comprises a conductive material, such as metal. In one embodiment, conductive substrate 80 comprises a copper alloy material and can be formed using masking and etching/stamping techniques. In one embodiment, conductive layer 27 is configured as a first current-carrying electrode for first semiconductor device 10 and is electrically connected to conductive lead 81 using a conductive connective structure 91. In one embodiment, conductive connective structure 91 can be a conductive clip. In accordance with one embodiment, conductive layer 19 is configured as a second current-carrying electrode for first semiconductor device 10 and is electrically connected to conductive leads 82 and 84 as well as to conductive layer 77 of second semiconductor device 60. In other embodiments, conductive connective structure 91 can be one or more conductive wires. Conductive layer 28 can be configured as a first control electrode (e.g., a gate electrode) for first semiconductor device 10 and is electrically connected to conductive lead 86 using a conductive connective structure 92. In one embodiment, conductive connective structure 92 can be a conductive wire.

In one embodiment, conductive layer 77 can be configured as a first current-carrying electrode for second semiconductor device 60. Conductive layer 79 can be configured as a second current-carrying electrode of second semiconductor device 60, and is attached to conductive lead 83. Semiconductor device 60 can further include a control electrode (not shown) for second semiconductor device 60 and can be electrically connected to another conductive lead using, for example, a conductive connective structure 92.

Package body 96 is provided to encapsulate first semiconductor device 10, second semiconductor device 60, conductive connective structures 91 and 92, and portions of conductive lead frame 80. As illustrated in FIG. 1, portions of conductive leads 81-86 are exposed to the outside through package body 96 to enable connecting stacked semiconductor device structure 100 to a next level of assembly, such as a printed circuit board. Package body 96 may be a polymer composite material, such as an epoxy mold compound for performing encapsulation through a molding process (e.g., overmolding or cavity molding), a liquid encapsulating member for performing encapsulation through a dispenser, or other insulating material(s) as known to those of skill in the art.

Figure 2:
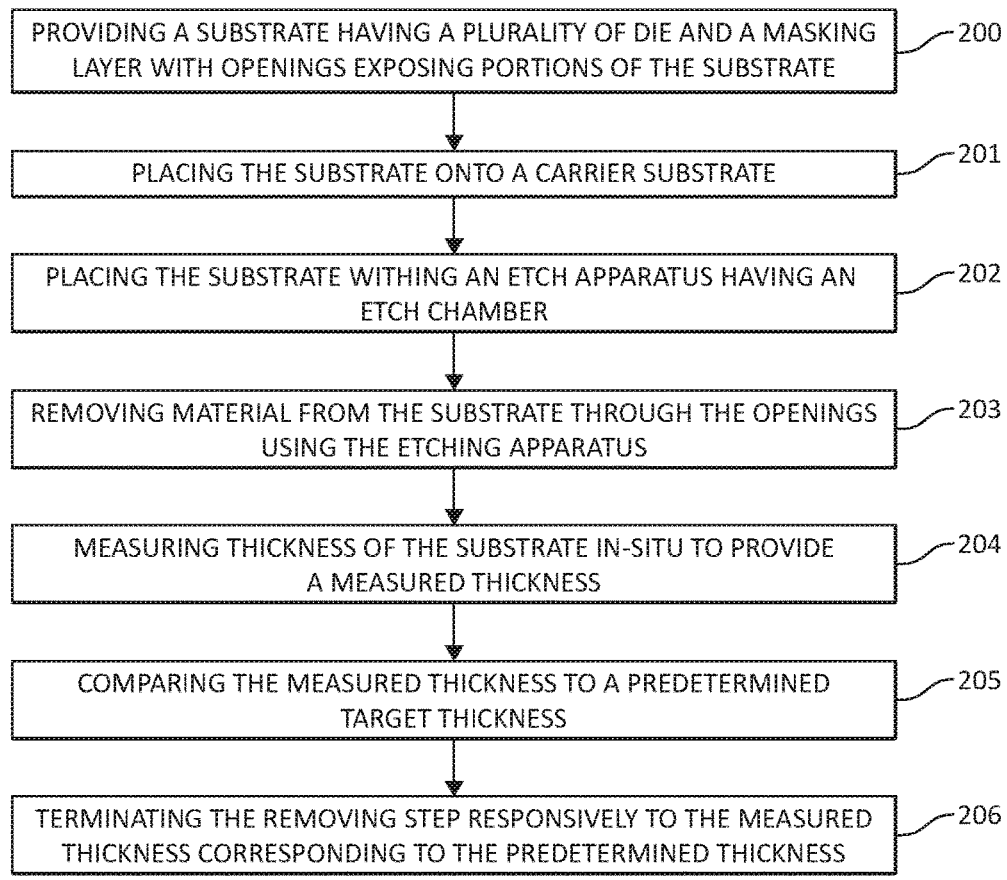
FIG. 2 is a flow chart of an embodiment of a method for removing material from a substrate in accordance with the present invention.
Figure 3:
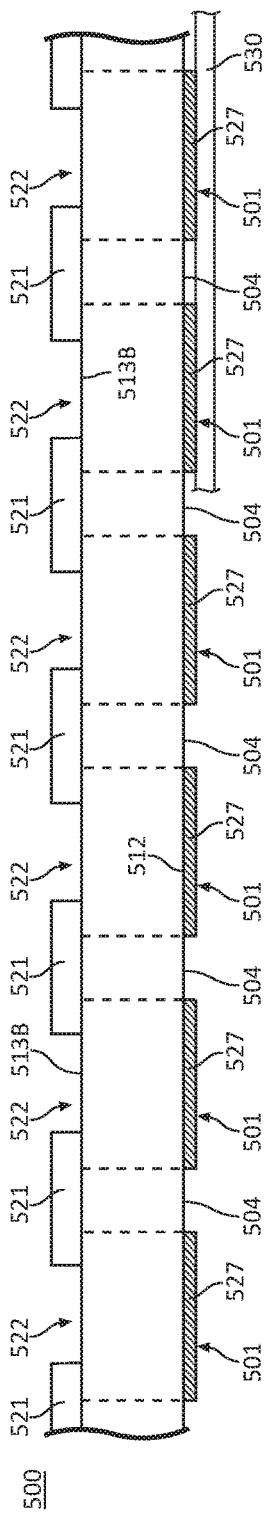
FIG. 3 illustrates a cross-sectional view of the substrate at an intermediate stage of fabrication in accordance with the present invention.

Turning now to FIGS. 2-7, a method in accordance with a first embodiment is described for providing or forming recessed portions 23. FIG. 2 illustrates a flow chart of a method of removing material from a substrate, such as substrate 500 in accordance with the first embodiment, and FIG. 3 illustrates a partial cross-sectional view of substrate 500 at an intermediate step of fabrication in accordance with step 200 of FIG. 2. In accordance with step 200, the method in accordance with the present embodiment includes providing substrate 500 having a first major surface 512 and an opposing second major surface 513B. In one embodiment, substrate 500 is provided with a plurality of electronic device 501 or semiconductor devices 501 separated by spaces.

Substrate 500 can be a semiconductor material, including but not limited to, single crystalline semiconductor materials comprising one or more Group IV elements, heterojunction semiconductor materials, such IV-IV or semiconductor materials, combinations thereof, combinations thereof with insulating materials, ceramic materials, glass materials, semiconductor packaging materials, or similar materials suitable for forming recessed regions as known to those of skill in the art. In one embodiment, substrate 500 comprises a silicon substrate and has a thickness in range from about 705 microns to about 745 microns for a 200 millimeter diameter substrate. In other embodiments, substrate 500 may be thinned using a global removing process, such as grinding, lapping, and/or etching can be used to remove a portion of semiconductor wafer 500 to provide second major surface 513B. In one embodiment, the thickness of semiconductor wafer 500 after the global removal process typically is in a range from 75 microns through about 150 microns.

In the present embodiment, each of plurality of semiconductor devices 501 is separated by spaces 504 or singulation lines 504 (represented by the vertically oriented dashed lines), which may be on the order of 5-20 microns wide when plasma singulation is used. Otherwise singulation lines 504 can be 35 microns through 75 microns wide if laser or saw singulation techniques are used. In one embodiment, a patterned conductive layer 527 is disposed adjacent to first major surface 512, which can be separated in part from first major surface 512 by a dielectric layer or layers (not shown).

In accordance with the present embodiment, substrate 500 is further provided with a masking layer 521, protective layer 521, or masking structure 521 adjacent to second major surface 513B. Masking layer 521 is configured with a plurality of openings 522 that extend through or at least partially through masking layer 521 in a preselected pattern to expose portions of second major surface 513B of substrate 500. Openings 522 can be provided for example, a double-sided photolithographic alignment tool to properly align each opening 522 to a corresponding active device region provided adjacent first major surface 512. In accordance with the present embodiment, openings 522 can have a variety of shapes including, for example, square shapes, rectangular shapes, polygonal shapes, round shapes, and random shapes. Moreover, the placement of openings 522 can be substantially centrally aligned to each semiconductor device 501, or the placement can be offset towards one or more sides of each semiconductor device 501. Further, it is understood that masking layer 521 can be configured to provide each semiconductor device 501 with multiple sidewall portions or with a single sidewall portion.

In one embodiment, masking layer 521 comprises a polymer layer, such as a photoresist layer or a polyimide layer. In another embodiment, masking layer 521 comprises a dielectric material, such as an oxide, or masking layer 521 comprises a conductive material, such as a metal. In accordance with the present embodiment, masking layer 521 is configured such that portions of masking layer 521 overlap or cover singulation lines 504 as well as portions of semiconductor devices 501 adjoining singulation lines 504. In accordance with the present embodiment, those portions semiconductor devices 501 covered by masking layer 521 correspond to sidewall portions 5141 for each semiconductor device 501, which will be formed in a subsequent operation of the present method.

With reference now to FIGS. 2 and 3, in an optional step 201 substrate 500 can be attached to or placed in contact with a support substrate 530 (only partially shown to indicate it is optional). In one embodiment, support substrate 530 can be a transfer tape, or a carrier tape that facilitates supporting substrate 500. In one embodiment, carrier substrate 530 can be attached to a frame (not shown) made of a rigid material, such as stainless steel. In other embodiments, carrier substrate 530 may not be used.

Figure 4:
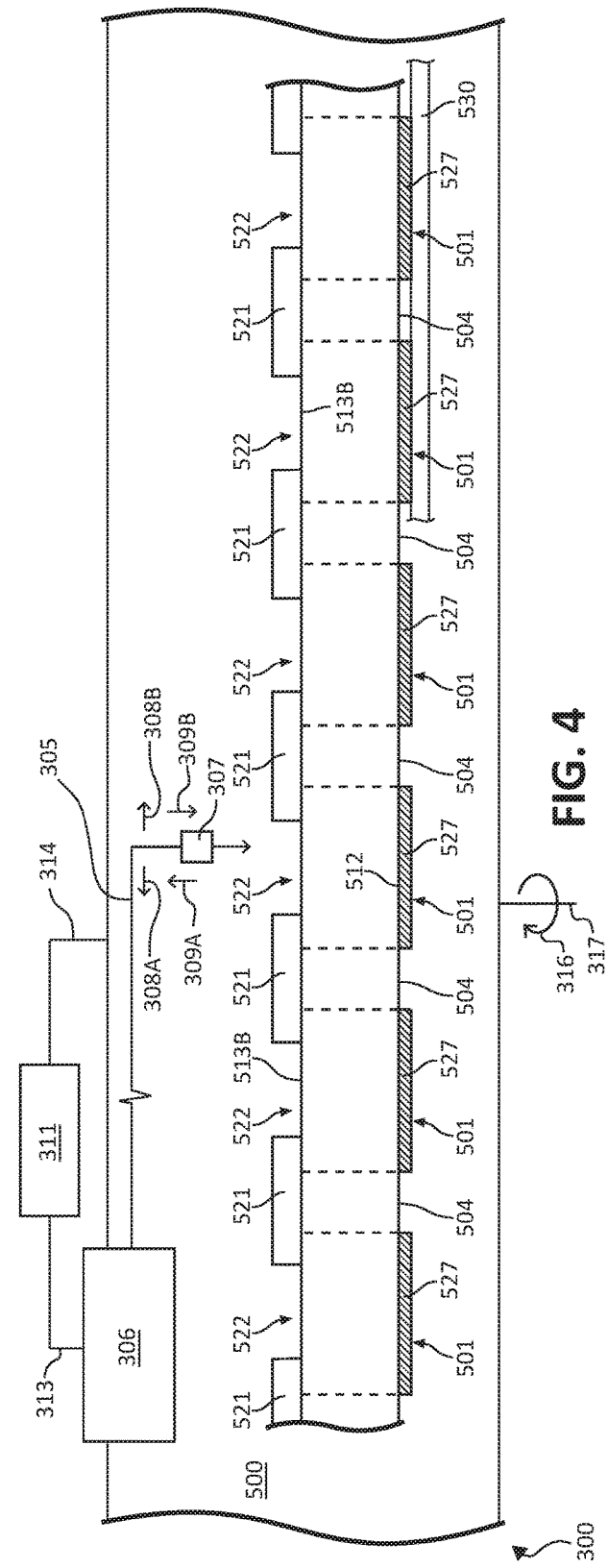
FIGS. 4 and 5 illustrate the embodiment of FIG. 3 within an etching apparatus having a thickness measuring apparatus used during the removal of material from the substrate in accordance with the present invention.
Figure 5:
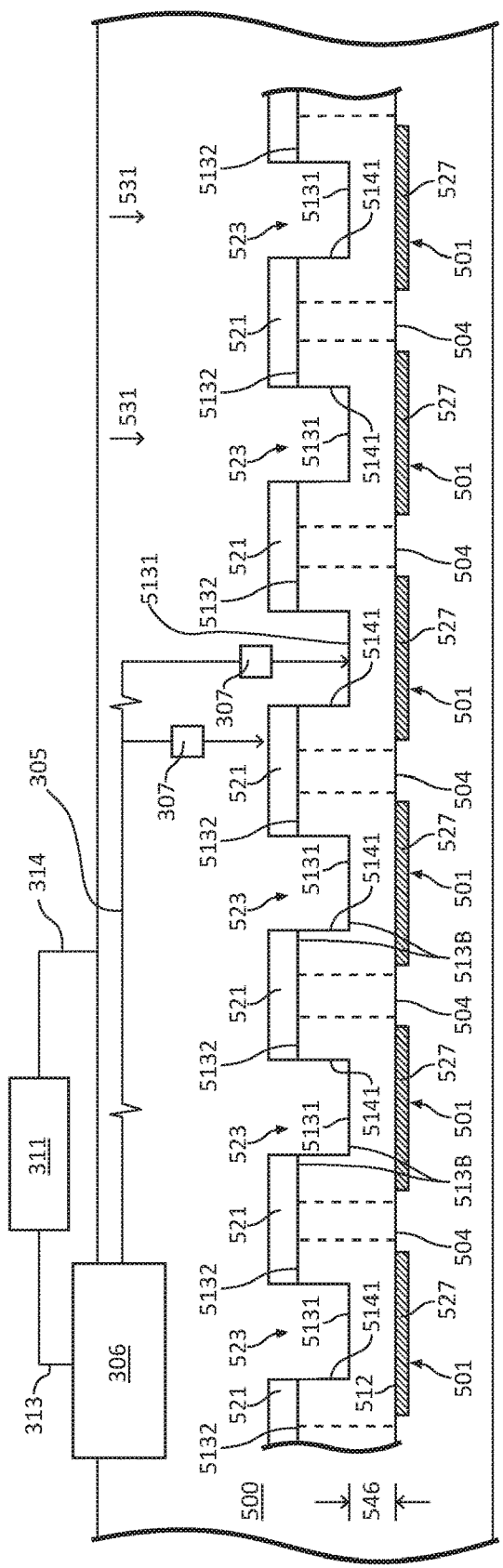

With reference to FIGS. 2, 4, and 5, in step 202 substrate 500 (and carrier substrate 530 if used) is placed within an etching apparatus 300 having an etch chamber 301 or processing chamber 301, and in step 203 material from substrate 500 is removed through openings 522 in masking layer 521 using etching apparatus 300. FIG. 4 illustrates a cross-sectional view of substrate 500 within etching apparatus 300 before the removal step begins, and FIG. 5 illustrates a cross-sectional view of substrate 500 after portions of substrate 500 have been removed to form, for example, recessed portions 523. It is understood that the present embodiment can be used to form other structures as well, such as multiple recessed portions within a single semiconductor device 501.

In one embodiment, etching apparatus 300 can be a plasma etching apparatus. In accordance with the present embodiment, etching apparatus 300 is adapted to include a thickness measuring apparatus 306, which is configured to monitor or measure the thickness of substrate 500 during the etching or removal process. Stated another way, thickness measuring apparatus 306 is configured to monitor or measure the amount of material removed from substrate 500 through openings 522 to form, for example, recessed regions 523 during the etching or removal process. In one embodiment, thickness measuring apparatus 306 is disposed at least in part within etch chamber 301 to provide in-situ measurements of substrate 500 during the etching or removal process. In an alternative embodiment, thickness measuring apparatus 306 is disposed external to etch chamber 301 (but still within etching apparatus 300), for example, within a substrate handler or loading station (not shown), which is part of etching apparatus 300. In this alternative embodiment, thickness measuring apparatus 306 can be used to monitor more than one etch chamber within etching apparatus 300.

In one embodiment, thickness measuring apparatus 306 comprises a transducer device 307 that is configured to measure the thickness of substrate 500 during the removal process. Transducer device 307 is in communication with thickness measuring apparatus 306 as generally designated, for example, by communication path 305. In one embodiment, device 307 comprises an infra-red (IR) sensor device. In another embodiment, device 307 comprises a laser device. In a still further embodiment, device 307 comprises a light microscopy device. In one preferred embodiment, transducer device 307 comprises a non-contact transducer device that does not make direct contact to substrate 500. In some embodiments, transducer device 307 is configured to scan across substrate 500 as generally denoted by arrows 308A and 308B. In other embodiments, transducer device 307 can be further configured to raise and lower with respect to substrate 500 as generally denoted by arrows 309A and 309B. In one embodiment, transducer device 307 is coated with a protective material that is resistant to the etch chemistry used to remove material from substrate 500. In other embodiments, transducer device 307 is disposed within etch chamber 301 at a location that reduces or minimizes the exposure of transducer device 307 to the etch chemistry.

In one embodiment, thickness measurement apparatus 306 is in communication (generally designated, for example, as communication path 313) with a controller apparatus 311 configured to provide process and equipment control for etching apparatus 300. In one embodiment, thickness measurement information obtained using, for example, transducer device 307 is provided to controller apparatus 311 and the etching process is ended in accordance with etch termination practices (generally designated, for example, as communication path 314).

With reference now to FIG. 5 and steps 203, 204, 205, and 206 of FIG. 2, in one embodiment, a portion substrate 500 is etched to remove material from substrate 500 through openings 522 in masking layer 521. In one embodiment, portions of substrate 500 exposed through opening 522 of masking layer 521 are removed to provide recessed portions 523, which have a shape similar to or defined by openings 522. In accordance with the present embodiment, recessed portions 523 are defined by portion 5131 of second major surface 513B and sidewall portions 5141, which extend between portion 5131 and another portion 5132 of second major surface 513B. In accordance with the present embodiment, recessed portions 523 are formed in etch chamber 301 using a chemistry (generally designated using arrows 531) that selectively etches the material of substrate 500 at a much higher rate than that of dielectrics and/or other masking materials used for masking layer 521. In one embodiment, substrate 500 can be etched using a process commonly referred to as the Bosch process.

In accordance with step 204, as part of the etching process, thickness measurement apparatus 306 is used to measure thickness (for example, thickness 546) of substrate 500 in-situ or within etching apparatus 300. In step 205, the measured thickness is compared to a predetermined target thickness, for example, using controller apparatus 311 or using thickness measuring apparatus 306. In accordance with step 206, the etching or removal process is terminated responsively to the measured thickness (for example, thickness 546) corresponding to the predetermined thickness.

In one embodiment as generally illustrated in FIG. 5 (and further described in conjunction with FIG. 6), the thickness of substrate 500 proximate to portion 5132 is measured (for example, using transducer device 307), the thickness of substrate 500 proximate to portion 5131 is measured, and the difference taken to provide thickness 546. In one embodiment, thickness measuring apparatus 306 measures various high points and various low points within substrate 500. In one embodiment, the difference between the high point and low point values is determined and a distribution across substrate 500 is compared against a predetermined thickness target and the removal process is terminated responsive to the measured thickness corresponding to the predetermined thickness target. In another embodiment, a predetermined location on substrate 500 is periodically aligned with thickness measuring apparatus 306 (for example, aligned with transducer device 307), and thickness measurements are taken at set time intervals. In other embodiments, etching apparatus 300 is configured to rotate (generally designated by arrow 316 about axis 317) substrate 500 proximate to thickness measuring apparatus 306 (for example, proximate to transducer device 307). In further embodiments, thickness measuring apparatus 306 continuously measures the thickness of substrate 500 during the etching process at a point time proximate to when or when the measured thickness corresponds to the predetermined thickness.

Figure 6:
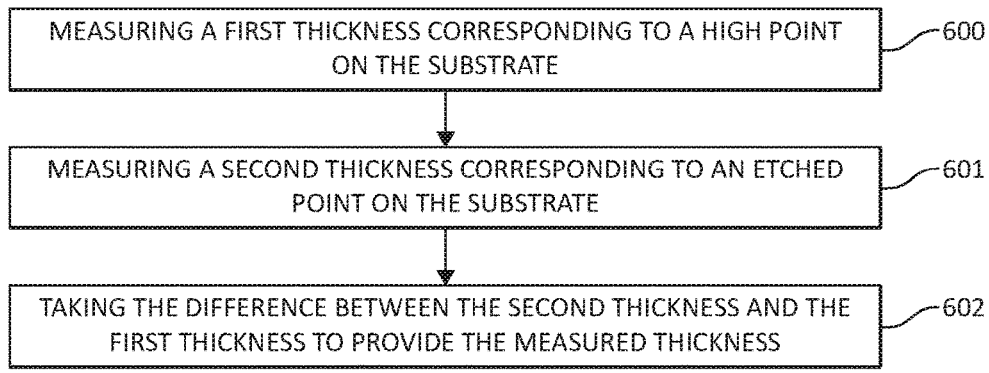
FIG. 6 illustrates a flow chart of a method in accordance with an embodiment of the present invention.

FIG. 6 illustrates a flow chart of a method in accordance with another embodiment. In step 600, the method includes measuring a first thickness corresponding to a high point on a substrate, such as substrate 500. In one embodiment, the first thickness can correspond to the thickness of substrate 500 at surface 5132 illustrated in FIG. 5. In other embodiments, the first thickness can correspond to the thickness of substrate 500 including the thickness of masking layer 521. In other embodiments, the first thickness can correspond to the thickness of substrate 500 including the thickness of masking layer 521 and any other films or layers disposed overlying first major surface 512 of substrate 500, such as conductive layers 527. In step 601, the method includes measuring a second thickness corresponding to a low point on substrate 500. In one embodiment, the second thickness can correspondent to the thickness of substrate 500 at surface 5131. In step 602, the method includes taking the difference between the second thickness and the first thickness or vice versa to provide the measured thickness, which is then compared to the predetermined thickness as described in step 205 of FIG. 2.

Figure 7:
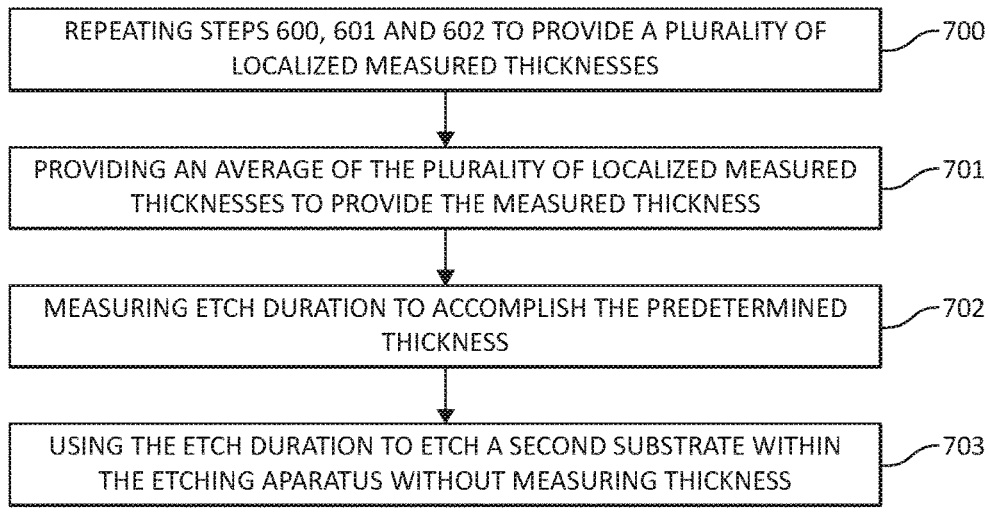
FIG. 7 illustrates a flow chart of a method in accordance with an embodiment of the present invention.

FIG. 7 illustrates a flow chart of a method in accordance with a further embodiment. In step 700, the steps 600, 601, and 602 of FIG. 6 are repeated more than once at difference locations of substrate 500 to provide a plurality of localized thicknesses or thickness measurements. In step 701, the method includes determining or providing an average of the plurality of localized thicknesses to provide the measured thickness that is compared to the predetermined thickness in step 205 of FIG. 2. In a further embodiment, in step 703, the duration of the etch or removal process is measured until the predetermined thickness is accomplished. By way of example, the duration can be measured by controller apparatus 311. In step 704, the method includes using the determined etch duration or time from step 703 to set the process conditions for a second substrate to be processed or etched within etching apparatus 300. In one embodiment, steps 703 and 704 are a method of periodically measuring the thickness for only a portion of substrates within a batch of substrates so that the other portion of the batch is processed without the need to monitor thickness during the etching or removal process for each substrate.

With reference back to FIG. 5 and by way of example, side wall portions 5141 can have a height (i.e., distance between portions 5132 and 5131) in a range from about 50 microns through about 100 microns. In the present embodiment, masking layer 521 can be removed after recessed portions 523 are removed. It is understood that conductive layer 527 can be provided as well at this stage of fabrication instead of earlier. Also, it is understood that sidewall portions 5141 can be provided on one, two, three, or four sides of one or more semiconductor devices 501 using a desired and preselected masking scheme to provide masking layer 521. Further, sidewall portions 5141 can be provided with inner sidewall surfaces having sloped or curved shapes in cross-sectional view.

FIG. 8 illustrates a partial cross-sectional view of substrate 500 after additional processing. In one embodiment, after masking layer 521 is removed, conductive layer 519 is provided disposed adjacent or along second major surface 513B including portions 5131 and 5132 and the sidewalls of sidewall portions 5141. By way of example, conductive layer 519 can be formed using conductive deposition techniques, such as evaporation, sputtering, or other techniques as known to those of skill in the art. In one embodiment, evaporation is used to provide conductive layer 519 having a generally uniform thickness along the surfaces of second major surface 513B. In some embodiments, electrochemical deposition processes, such as plating processes can be used to form conductive layer 519. Such processes include, for example, electroless plating and electroplating processes. In other embodiments, combinations of deposition techniques may be used to form conductive layer 519. In one embodiment, conductive layer 519 can have a thickness greater than about 10.0 microns and can be a metal, such as Cu/Ni, Cu/Ni/Au, Ti/Ni/Au, Ti/Ni/Ag, Ti/Ni/Ag/Sn, Cr/Ni/Au, Cr/Ni/Ag, or other similar conductive materials as known to those of skill in the art.

FIG. 9 illustrates a partial cross-sectional view of substrate 500 after still further processing. In one embodiment, semiconductor wafer 500 is attached to a carrier substrate 561, such as a carrier tape attached to a supporting frame. More particularly, conductive layer 519 can be placed or affixed to carrier substrate 561 as generally illustrated in FIG. 9. In one preferred embodiment, substrate 500 and carrier substrate 561 are placed within a plasma etching chamber and plasma etching is used to remove portions of substrate 500 in singulation lines 504 to provide a plurality of singulated semiconductor devices 501. In some embodiments, a protective masking layer 563 can be formed overlying at least portions of first major surface 512 with openings formed proximate to singulation lines 504 before etching substrate 500. Masking layer 563 can be a polymer layer, a dielectric layer, or other suitable protective materials as known to those of skill in the art.

The etching process can be performed using a chemistry that selectively etches the material of substrate 500 at a much higher rate than that of polymers, dielectrics and/or metals. In one embodiment, substrate 500 can be etched using the Bosch process. In one embodiment, substrate 500 can be etched using the Bosch process in a deep reactive ion etch system. In one embodiment, the width of singulation lines 504 can be from about 5 microns to about 20 microns. Such a width is sufficient to ensure that the openings that form singulation lines 504 can be formed completely through substrate 500 as generally illustrated in FIG. 9. In one embodiment, singulation lines 504 can be formed in about 5 to about 30 minutes using the Bosch process. A suitable etch apparatus is available from Plasma-Therm of St. Petersburg, Fla., U.S.A. It is understood the thickness measurement method described herein can be further used as part of the singulation processed described in conjunction with FIG. 9.

In order to separate conductive layer 519 within singulation lines 504, a separate removal process can be used, including those described in U.S. Pat. Nos. 8,664,089, 9,034,733, and 9,136,173, which are incorporated by reference herein. In other embodiments, laser and/or saw singulation methods can be used with singulation lines 504 being wider—for example, 35 microns through 75 microns wide. In further steps, plurality of singulated semiconductor devices 501 can be removed from carrier substrate 561 and combined with second semiconductor devices 60, conductive substrate 80, and package body 96 in accordance with, for example, the embodiment illustrated in FIG. 1.

In view of all of the above, it is evident that a novel method is disclosed. Included, among other features, is placing a substrate having a masking layer disposed along a major surface. The masking layer includes a plurality of openings that expose portions of the substrate. An etching apparatus is used to remove material from the substrate through the openings. In one embodiment, recessed portions are formed. During the removal processes, a thickness measuring apparatus is used to measure the thickness of the substrate to provide a means to more accurately detect when to end the removal process. The method provides, among other things, an efficient, more accurate, real-time, reliable, and cost effective process for removing material from substrates including substrates that do not use etch stop layers, and for forming regions that do not extend all the way through substrate. The method reduces cycle time and eliminates the need for test wafers compared to previous methods.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method of removing material from a semiconductor substrate comprising:
   providing the semiconductor substrate having a plurality of die formed as part of the semiconductor substrate and separated from each other by spaces, wherein:
      the semiconductor substrate comprises a first and a second opposing major surfaces;
      a masking layer is formed along the second major surface, the masking layer having a plurality of openings; and
      a patterned conductive layer is disposed adjacent the first major surface such that portions of the patterned conductive layer are separated by the spaces;
   placing the semiconductor substrate within an etching apparatus having an etch chamber;
   removing material from the semiconductor substrate through the plurality of openings using the etching apparatus;
   measuring a thickness of the semiconductor substrate within the etching apparatus to provide a measured thickness;
   comparing the measured thickness to a predetermined target thickness;
   terminating the removing step responsively to the measured thickness corresponding to the predetermined target thickness, wherein terminating the removing step occurs before etching entirely through the substrate to form a plurality of recessed portions within the substrate interposed between the spaces; and
   thereafter providing a conductive layer within the plurality of recessed portions.

2. The method of claim 1, wherein placing within the etching apparatus comprises placing within a plasma etching apparatus.

3. The method of claim 1 further comprising:
   after the step of providing the conductive layer:
      placing the semiconductor substrate onto a carrier substrate;
      singulating the semiconductor substrate through the spaces to form a plurality of singulated die; and
      disposing a semiconductor die within one of the recessed portions of one of the plurality of singulated die.

4. The method of claim 3, wherein:
disposing the semiconductor die comprises:
providing a conductive substrate having conductive leads;
attaching the semiconductor die to a first conductive lead; and
attaching the one of the plurality of singulated die to a second lead and to the semiconductor die.

5. The method of claim 1, wherein measuring comprises:
a. measuring a first thickness corresponding to a high point on the semiconductor substrate;
b. measuring a second thickness corresponding to an etched point on the semiconductor substrate; and
c. subtracting the second thickness from the first thickness to provide the measured thickness.

6. The method of claim 5 further comprising:
repeating steps a, b, and c at more than one location on the semiconductor substrate to provide a plurality of localized measured thicknesses;
providing an average of the plurality of localized measured thicknesses to provide the measured thickness;
measuring etch duration to accomplish the predetermined target thickness; and
using the etch duration to etch a second semiconductor substrate within the etching apparatus without measuring thickness.

7. The method of claim 1, wherein measuring comprises measuring within the etch chamber at predetermined intervals during the removal step.

8. The method of claim 1, wherein measuring comprises continuously measuring before terminating the removing step.

9. The method of claim 1, wherein measuring comprises measuring with a laser.

10. The method of claim 1, wherein measuring comprises measuring using one of light microscopy and an infra-red source.

11. The method of claim 1, wherein measuring comprises measuring without physically contacting the semiconductor substrate.

12. A method of removing material from a substrate comprising:
providing the substrate having a plurality of die formed as part the substrate and separated from each other by spaces, wherein the substrate has a first and a second opposing major surfaces, and wherein a protective layer is formed along one of the first major surface and the second major surface, the protective layer having a plurality of openings exposing portions of the substrate disposed between the spaces;
placing the substrate within an etching apparatus having an etch chamber; and
removing material from the substrate through the openings using the etching apparatus, wherein during the removing step, the method further comprising:
measuring a thickness of the substrate within the etching apparatus to provide a measured thickness;
comparing the measured thickness to a predetermined thickness;
terminating the removing step responsively to the measured thickness corresponding to the predetermined thickness, wherein terminating the removing step occurs before etching entirely through the substrate to form a plurality of recessed portions within the substrate interposed between the spaces; and
thereafter providing a conductive layer within the plurality of recessed portions including sidewall portions of the plurality of recessed portions.

13. The method of claim 12, wherein:
providing the substrate comprises providing the substrate absent an etch stop layer;
providing the substrate comprising providing a patterned conductive layer disposed adjacent the first major surface such that portions of the patterned conductive layer are separated by the spaces; and
providing the conductive layer comprises disposing the conductive layer along the second major surface including portions disposed outside of the plurality of recessed portions.

14. The method of claim 12 further comprising:
after the step of providing the conductive layer:
placing the substrate onto a carrier substrate;
singulating the substrate through the spaces to form a plurality of singulated die; and
disposing a semiconductor die within one of the recessed portions of one of the plurality of singulated die, wherein the predetermined thickness is selected to accommodate the semiconductor die within the one of the recessed portions.

15. The method of claim 12, wherein measuring comprises:
a. measuring a first thickness corresponding to a high point on the substrate;
b. measuring a second thickness corresponding to an etched point on the substrate; and
c. subtracting the second thickness from the first thickness to provide the measured thickness.

16. The method of claim 15 further comprising:
repeating steps a, b, and c at more than one location on the substrate to provide a plurality of localized measured thicknesses; and
providing an average of the plurality of localized measured thicknesses to provide the measured thickness.

17. The method of claim 12, wherein measuring comprises measuring without physically contacting the substrate.

18. A method of removing material from a semiconductor substrate comprising:
providing the semiconductor substrate having a plurality of die formed as part the semiconductor substrate and separated from each other by spaces, wherein the semiconductor substrate has a first and a second opposing major surfaces, and wherein the semiconductor substrate comprises active device regions adjacent the first major surface, and wherein a masking layer is formed along the second major surface, the masking layer having a plurality of openings that expose portions of the semiconductor substrate, and wherein a patterned conductive layer is disposed adjacent the first major surface such that portions of the patterned conductive layer are separated by the spaces;
placing the semiconductor substrate within a plasma etching apparatus having a processing chamber;
removing material from the semiconductor substrate through the openings using the plasma etching apparatus, wherein during the removing step, the method further comprises:
measuring material removal within the plasma etching apparatus to provide a measured thickness corresponding to an amount of material removed;
comparing the measured thickness to a predetermined thickness; and terminating the removing step responsively to the measured thickness corresponding to the predetermined thickness, wherein the step of terminating occurs before etching entirely through the semiconductor substrate to provide a plurality of recessed regions; and thereafter providing a conductive layer within the plurality of recessed portions.

19. The method of claim 18 further comprising:

after the step of providing the conductive layer:
- placing the semiconductor substrate onto a carrier substrate;
- plasma singulating the semiconductor substrate through the spaces to form a plurality of singulated die, wherein each singulated die has at least one recessed region extending inward from the second major surface; and
- disposing a semiconductor die within the at least one recessed region.

20. The method of claim 19, wherein:

providing the semiconductor substrate comprises providing semiconductor substrate absent an etch stop layer; and measuring comprises measuring within the etch chamber more than once during the removal step; and disposing the semiconductor die comprises:
- providing a conductive substrate having conductive leads;
- attaching the semiconductor die to a first conductive lead; and
- attaching one of the singulated die to a second lead and to the semiconductor die.

* * * * *